US012601763B2

(12) United States Patent

Moore et al.

(10) Patent No.: US 12,601,763 B2

(45) Date of Patent: Apr. 14, 2026

(54) CURRENT SENSOR WITH ADJACENT CONDUCTOR REJECTION

(71) Applicant: Schweitzer Engineering Laboratories, Inc., Pullman, WA (US)

(72) Inventors: Johnny J. Moore, Moscow, ID (US); David Kenny, Pullman, WA (US); Raymond W. Rice, Pullman, WA (US); Miralem Cosic, Spokane, WA (US); Lyssa W. Blood, Potlatch, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 141 days.

(21) Appl. No.: 18/624,466

(22) Filed: Apr. 2, 2024

(65) Prior Publication Data

US 2025/0199035 A1 Jun. 19, 2025

Related U.S. Application Data

(60) Provisional application No. 63/611,940, filed on Dec. 19, 2023.

(51) Int. Cl.
G01R 15/18 (2006.01)
G01R 19/15 (2006.01)
(Continued)

(52) U.S. Cl.
CPC ........... G01R 15/181 (2013.01); G01R 19/15 (2013.01); G01R 19/155 (2013.01); (Continued)

(58) Field of Classification Search
CPC .... G01R 15/181; G01R 19/15; G01R 19/155; G01R 19/165
See application file for complete search history.

(56) References Cited

U.S. PATENT DOCUMENTS

| | | | |
|---|---|---|---|
| 1,942,575 A | 1/1934 | Shapiro | |
| 2,599,550 A | 6/1952 | Fraser | |

(Continued)

FOREIGN PATENT DOCUMENTS

| | | | |
|---|---|---|---|
| EP | | 573350 | 12/1993 |
| EP | | 652441 | 5/1995 |

(Continued)

OTHER PUBLICATIONS

Pulse Electronics, Sidewinder Current Sensor, Jul. 28, 2011.

(Continued)

*Primary Examiner* — Reena Aurora

(74) *Attorney, Agent, or Firm* — Justin K. Flanagan

(57) ABSTRACT

A multiport current sensor is disclosed for measuring current. The sensor may include multiple CT or Rogowski coil segments or sections arranged in a closed loop configuration around a monitored phase line or other electrical conductor. An adjacent phase rejection circuit compares the magnitudes and/or phase angles of the voltage signals from the multiple coil segments. The adjacent phase rejection circuit may detect if a fault in an adjacent phase line or other electrical conductor is affecting the output signal of the current sensor by more than a threshold amount. The adjacent phase rejection circuit may additionally or alternatively indicate whether the measured values are valid for detecting a fault on the monitored phase line or other electrical conductor.

22 Claims, 16 Drawing Sheets

(51) Int. Cl.

| | |
|---|---|
| *G01R 19/155* | (2006.01) |
| *G01R 19/165* | (2006.01) |
| *G01R 19/25* | (2006.01) |
| *H01F 38/30* | (2006.01) |

(52) U.S. Cl.

CPC ....... *G01R 19/165* (2013.01); *G01R 19/2513* (2013.01); *H01F 38/30* (2013.01)

(56) References Cited

U.S. PATENT DOCUMENTS

| | | | |
|---|---|---|---|
| 2,845,562 | A | 7/1958 | Bendell |
| 3,203,077 | A | 8/1965 | Zimmerle |
| 3,684,955 | A | 8/1972 | Adams |
| 3,942,029 | A | 3/1976 | Kawakami |
| 4,616,176 | A | 10/1986 | Mercure |
| 4,700,131 | A | 10/1987 | Miller |
| 4,709,205 | A | 11/1987 | Baurand |
| 4,799,005 | A | 1/1989 | Fernandes |
| 4,803,425 | A | 2/1989 | Swanberg |
| 4,808,959 | A | 2/1989 | Weissman |
| 4,810,954 | A | 3/1989 | Fam |
| 4,831,327 | A | 5/1989 | Chenier |
| 4,899,246 | A | 2/1990 | Tripodi |
| 5,012,218 | A | 4/1991 | Haug |
| 5,055,816 | A | 10/1991 | Altman |
| 5,066,904 | A | 11/1991 | Bullock |
| 5,223,790 | A | 6/1993 | Baran |
| 5,233,324 | A | 8/1993 | Beihoff |
| 5,272,460 | A | 12/1993 | Baumgartner |
| 5,414,400 | A | 5/1995 | Gris |
| 5,442,280 | A | 8/1995 | Baudart |
| 5,461,299 | A | 10/1995 | Bruni |
| 5,461,309 | A | 10/1995 | Baudart |
| 5,627,475 | A | 5/1997 | Strosser |
| 5,808,846 | A | 9/1998 | Holce |
| 5,831,506 | A | 11/1998 | Crepel |
| 5,852,395 | A | 12/1998 | Bosco |
| 5,917,316 | A | 6/1999 | Bosco |
| 5,982,265 | A | 11/1999 | Von Skarczinski |
| 6,008,711 | A | 12/1999 | Bolam |
| 6,094,044 | A | 7/2000 | Kustera |
| 6,137,394 | A | 10/2000 | Holmes |
| 6,184,672 | B1 | 2/2001 | Berkcan |
| 6,203,077 | B1 | 3/2001 | Schlack |
| 6,215,296 | B1 | 4/2001 | Arnoux |
| 6,255,565 | B1 | 7/2001 | Tamura |
| 6,288,625 | B1 | 9/2001 | Kaczkowski |
| 6,300,857 | B1 | 10/2001 | Herwig |
| 6,313,623 | B1 | 11/2001 | Kojovic |
| 6,351,114 | B1 | 2/2002 | Iwasaki |
| 6,366,076 | B1 | 4/2002 | Karrer |
| 6,369,687 | B1 | 4/2002 | Akita |
| 6,380,727 | B1 | 4/2002 | Jitaru |
| 6,420,952 | B1 | 7/2002 | Redilla |
| 6,437,555 | B1 | 8/2002 | Pioch |
| 6,566,854 | B1 | 5/2003 | Hagmann |
| 6,614,218 | B1 | 9/2003 | Ray |
| 6,624,624 | B1 | 9/2003 | Karrer |

| | | | |
|---|---|---|---|
| 6,680,608 | B2 | 1/2004 | Kojovic |
| 6,731,193 | B2 | 5/2004 | Meier |
| 6,822,547 | B2 | 11/2004 | Saito |
| 6,825,650 | B1 | 11/2004 | McCormack |
| 6,940,702 | B2 | 9/2005 | Kojovic |
| 6,958,673 | B2 | 10/2005 | Suzuki |
| 6,965,225 | B2 | 11/2005 | De Buda |
| 7,009,486 | B1 | 3/2006 | Goeke |
| 7,078,888 | B2 | 7/2006 | Budillon |
| 7,106,162 | B2 | 9/2006 | Saito |
| 7,109,838 | B2 | 9/2006 | Brennan |
| 7,227,441 | B2 | 6/2007 | Skendzic |
| 7,227,442 | B2 | 6/2007 | Skendzic |
| 7,474,192 | B2 | 1/2009 | Skendzic |
| 7,545,138 | B2 | 6/2009 | Wilkerson |
| 7,733,208 | B2 | 6/2010 | Wolfgram |
| 7,825,763 | B2 | 11/2010 | Dupraz |
| 7,902,812 | B2 | 3/2011 | Kojovic |
| 8,928,337 | B2 | 1/2015 | Kessler |
| 2003/0090356 | A1 | 5/2003 | Saito |
| 2004/0008461 | A1 | 1/2004 | Kojovoc |
| 2004/0012901 | A1 | 1/2004 | Kojovoc |
| 2004/0178875 | A1 | 9/2004 | Saito |
| 2005/0052268 | A1 | 3/2005 | Pleskach |
| 2005/0156587 | A1 | 7/2005 | Yakymyshyn |
| 2005/0156703 | A1 | 7/2005 | Twaalfhoven |
| 2005/0248430 | A1 | 11/2005 | Dupraz |
| 2006/0066425 | A1 | 3/2006 | Gruner |
| 2006/0174834 | A1 | 8/2006 | Long |
| 2006/0176140 | A1 | 8/2006 | Skendzic |
| 2006/0232263 | A1 | 10/2006 | Kovanko |
| 2006/0232265 | A1 | 10/2006 | Fritsch |
| 2007/0199176 | A1 | 8/2007 | McClellan |
| 2008/0252409 | A1 | 10/2008 | Kojima |
| 2011/0025304 | A1 | 2/2011 | Lint |
| 2011/0025305 | A1 | 2/2011 | Lint |
| 2011/0148561 | A1 | 6/2011 | Lint |
| 2025/0199034 | A1* | 6/2025 | Fischer ................. G01R 19/15 |

FOREIGN PATENT DOCUMENTS

| | | |
|---|---|---|
| EP | 808460 | 11/1997 |
| EP | 587491 | 4/1998 |
| EP | 889490 | 1/1999 |
| EP | 1596205 | 11/2005 |
| GB | 2034487 | 6/1980 |
| GB | 2259150 | 3/1993 |
| JP | 2001102230 | 4/2001 |
| JP | 2003173922 | 6/2003 |
| JP | 2004228296 | 8/2004 |
| WO | 72027 | 11/2000 |

OTHER PUBLICATIONS

W.Z. Fam A Combined Current and Voltage Sensor for Metering and Protection in High Voltage Power Systems, Canadian Conference on Electrical Computer Engineering. p. 145-151, Sep. 1994.

Ramboz, J.D, "Machinable Rogowski Coil, Design, and Calibration," IEEE Transactions on Instrumentation and 3 Measurement, vol. 45, No. 2, pp. 511-515, Apr. 1996.

* cited by examiner $$\text{OperateQuantity} = V1_{Magnitude} * V2_{Magnitude} * \cos(V1_{Angle} - V2_{Angle})$$

CURRENT SENSOR WITH ADJACENT CONDUCTOR REJECTION

RELATED APPLICATIONS

This application claims priority to U.S. Provisional Application Ser. No. 63/611,940, filed on Dec. 19, 2023, entitled "Current Sensor with Adjacent Conductor Rejection," which is hereby incorporated by reference in its entirety for all purposes.

TECHNICAL FIELD

This disclosure relates to monitoring current in electrical conductors, including in three-phase power systems. More particularly, this disclosure relates to current sensors and fault detection systems for electrical conductors that are near other electrical conductors.

BRIEF DESCRIPTION OF THE DRAWINGS

Non-limiting and non-exhaustive examples of the disclosure are described with reference to the figures described below.

DETAILED DESCRIPTION

Figure 1A:
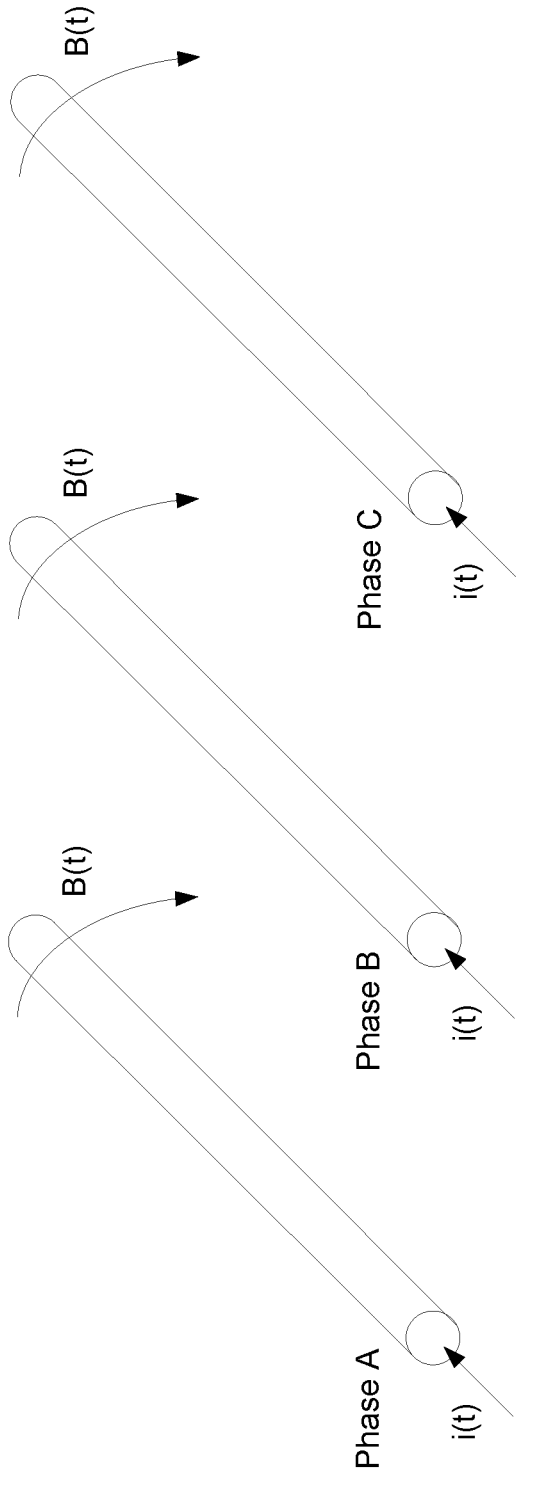
FIG. 1A illustrates a perspective diagram of three phase lines that are in close proximity, according to one embodiment.

Approaches for measuring current in power systems may utilize a single Rogowski coil sensor positioned around a monitored phase line or conductor. These single-coil sensors generate a voltage signal in response to the induced current, which is then processed to determine the magnitude of the current. However, single coil sensors may not accurately measure current when an adjacent phase line or other adjacent electrical conductor is in a fault condition. The unusually high fault current on the adjacent phase line or other conductor may result in erroneous measurements by the single Rogowski coil sensor.

Existing approaches do not address the issue of interference by induced currents in a faulted adjacent phase line or other conductor, which can lead to inaccurate current measurements. The presently described systems and methods include a multiport current sensor system and/or fault detection system that accounts for currents induced by adjacent phase line(s) and/or adjacent electrical conductor(s). The multiport current sensor system and/or fault detection system may prevent tripping of a breaker or other fault indication of a monitored phase line or electrical conductor in response to the system determining that induced currents from a fault in an adjacent line are affecting the accuracy of the measured current in the monitored line.

Various embodiments described herein may be of particular use to monitor one phase line of a three-phase power system (e.g., a powerline). Especially in the context of underground phase lines (e.g., in an enclosure at a terminal end of the phase lines), the phase lines may be closely spaced together (e.g., less than 30 centimeters apart, per applicable electrical codes, safety requirements, or other requirements applicable to a specific installation or configuration). It is appreciated that the embodiments described herein can be used in any of a wide variety of situations in which multiple current conductors are in relatively close proximity to one another. Additionally, embodiments of this disclosure may be used in systems in which one phase is split to go into two different directions, such as in a multiway junction point. The strength of a magnetic field caused by current in an electrical conductor is inversely proportional to distance. Accordingly, magnetic fields in closely spaced adjacent phase lines may impact sensor readings of individual phase lines. The presently described systems and methods may be used in the context of monitoring one or more phase lines in a multi-phase (e.g., three-phase) power system. However, it is appreciated that the various systems and methods may be used on any electrical conductor that is closely spaced to another electrical conductor. Accordingly, the terms "phase line," "electrical conductor," and "conductor" are interchangeably used herein. Moreover, descriptions of embodiments in the context of an electrical conductor are equally applicable to embodiments relating to a phase line and vice versa.

One embodiment of the presently described systems and methods includes a multiport current sensor to measure current. The multiport current sensor may include multiple Rogowski coil segments arranged to form at least a portion of a closed loop. The loop or partial loop (which may be round, oval, rectangular, etc.) may be positioned around a monitored phase line (or other conductor) such that each Rogowski coil segment is positioned in a different location relative to at least one adjacent phase line. Each Rogowski coil segment is associated with an individual coil segment port. In other embodiments, the multiport current sensor may include multiple CTs (e.g., traditional current transformers). Embodiments described in the context of Rogowski coils are understood to be adaptable for use with traditional CTs, where the output of the CT is a current proportional to the current on the conductor(s). The current from the CT may be used in conjunction with a burden or shunt resistor to convert the current to a voltage.

Magnetic fields from the monitored phase line and/or adjacent phase lines induce currents in the Rogowski coil segments that generate a voltage signal via each respective coil segment port. In some embodiments, a combining circuit may add phase-aligned magnitudes of the voltage signals from the coil segment ports of the multiple Rogowski coil segments to produce an output signal corresponding to a magnitude of a current in the monitored phase line. In some embodiments, the combining circuit may include one or more differential amplifiers to add phase-aligned magnitudes of the voltage signals from the coil segment ports. In some embodiments, the combiner circuit may include an individual integrator device for each coil segment port. Each coil segment port may be connected to an individual integrator device.

In various embodiments, an adjacent phase rejection circuit compares the magnitudes and phase angles of the voltage signals from the coil segment ports to detect that a fault in at least one of the adjacent phase lines is affecting the output signal of the combining circuit by more than a threshold amount. For example, the adjacent-phase rejection circuit may generate a flag signal to indicate that there is an adjacent-phase fault. The flag signal may, for example, be used to disable fault detection, fault triggering, or breaker actuation on the monitored phase line. In some examples, the adjacent phase rejection circuit includes a microprocessor to compare the magnitudes and unaligned phase angles of the voltage signals from the coil segment ports to determine the relative location of a magnetic field source.

In various embodiments, each Rogowski coil segment may comprise a helically coiled wire that is straight, curved, rounded, or otherwise shaped to be positioned proximate to or around a monitored conductor. In some embodiments, the Rogowski coil includes a center return connected to the helically coiled wire. In other embodiments, a helically coiled wire doubles back on itself to form a second, return helical coil. Other possible configurations and arrangements of Rogowski coils are possible, as understood in the art. In some specific embodiments, each Rogowski coil segment has a curved crescent shape. Overlapping or non-overlapping Rogowski coil segments may be arranged to form at least a portion of a circle, rectangle, oval, or other shape that can be positioned around the monitored phase line.

In one specific example, a multiport current sensor comprises or consists of two Rogowski coil segments that are configured to be positioned on opposing sides of the monitored phase line. The two Rogowski coil segments may be straight segments or curved or rounded segments. As described above, each Rogowski coil segment may be associated with an individual coil segment port. In some embodiments, each coil segment port may include one terminal connected to a helical coil of a Rogowski coil segment and another terminal connected to a center return connected to the helical coil. In some embodiments, two or more Rogowski coil segments may share a common terminal, such that the total number of terminals is equal to one more than the number of Rogowski coil segments. For example, two ports may be shared and form a center tap in a common center return.

In various embodiments, the multiport current sensor may be embodied within or used in conjunction with other components of a fault detection system. For example, a fault detection system may include a multiport current sensor to measure current in a monitored conductor. The multiport current sensor may include a first port connected to a first Rogowski coil section that is configured to be positioned on a first side of the monitored conductor in a location that is between the monitored conductor and an adjacent conductor. The multiport current sensor may include a second port connected to a second Rogowski coil section that is configured to be positioned on a second side of the monitored conductor that is opposite the first side of the monitored conductor.

In various embodiments, a multiport current sensor may be used to determine location information (e.g., direction, distance, etc.) of a faulted phase conductor relative to the monitored conductor. For example, a distance may be determined through an analysis of the ratio of the current contributed to each coil segment from the adjacent phase, in view of a known multisegmented Rogowski coil geometry.

The fault detection system may include an analysis circuit to receive a signal from each port of the multiport current sensor to produce an output signal indicating the current in the monitored conductor and an indication as to whether the measurement of the current in the monitored conductor is valid for fault detection in the monitored conductor. For example, the analysis circuit may include a combining circuit to add phase-aligned magnitudes of the signals from the first port and the second port to produce an output signal corresponding to the magnitude of a current in the monitored conductor. The analysis circuit may further include an adjacent conductor rejection circuit to compare the magnitudes and phase angles of the signals from the first and second ports to generate a flag signal indicating the detection of an adjacent-conductor fault.

In some examples, the fault detection system may further include a fault determination subsystem to receive the output signal and the flag signal. The fault detection system may then generate a fault signal indicating a fault on the monitored conductor in response to the output signal exceeding a fault threshold value. However, the fault signal may be ignored (e.g., not sent or not used) in response to the flag signal indicating the detection of the fault in the adjacent conductor.

According to one embodiment, the combining circuit includes a differential amplifier to subtract the inverted magnitude of the signal from the second port connected to the second Rogowski coil section from the non-inverted magnitude of the signal from the first port connected to the first Rogowski coil section. The adjacent conductor rejection circuit may include a first-stage summing amplifier to sum the unaligned magnitudes of the signals from the first port and the second port and a comparator circuit to detect the adjacent-conductor fault. The adjacent conductor rejection circuit may generate the flag signal in response to the output of the first stage summing amplifier exceeding a comparison threshold value.

In another embodiment, the fault current sensor system may include a current sensor to detect a current in a monitored conductor in proximity to an adjacent conductor. The current sensor may include a first Rogowski coil segment to generate a first voltage signal via a first port in response to current induced within the first Rogowski coil segment. The first Rogowski coil segment is configured to be positioned proximate to the monitored conductor in a location that is between the monitored conductor and the adjacent conductor. The current sensor further includes a second Rogowski coil segment to generate a second voltage signal via a second port in response to current induced within the second Rogowski coil segment. The second Rogowski coil segment is configured to be positioned on a second side of the monitored conductor that is opposite the first side of the monitored conductor. As such, the distance between the adjacent conductor and the first Rogowski coil segment is less than the distance between the adjacent conductor and the second coil segment.

In some embodiments, two ends of a phase line may be monitored for load current to determine the current in a "monitored" conductor. An adjacent conductor rejection circuit may identify that a detected fault current is from an adjacent conductor based on an output of a differential amplifier circuit (as described herein) using a common wire and the measurement from the two ends of the phase line.

In various embodiments, the current sensor may be positioned such that the distance between the monitored conductor and the first Rogowski coil segment is approximately equal to the distance between the monitored conductor and the second coil segment. Each of the first and second Rogowski coil segments may be straight, curved, crescent, or another shape. In some embodiments, the first and second Rogowski coil segments may be arranged to form at least a portion of a circle around the monitored conductor.

A supervision subsystem operates to evaluate magnitudes and phase angles of the first and second voltage signals to generate a supervisor signal. The supervisor signal may indicate that the first and second voltage signals are invalid for fault detection of the monitored conductor in response to a determination that the current in the adjacent conductor is inducing currents within the first and second Rogowski coil segments that exceed a threshold value. The supervisor signal may indicate that the first and second voltage signals are valid for fault detection of the monitored conductor in response to a determination that the current in the adjacent conductor is inducing currents within the first and second Rogowski coil segments that are less than a threshold value.

In various embodiments, the supervision subsystem evaluates the magnitudes and phase angles of the first and second voltage signals by calculating an operate quantity based on a product of (a) the magnitude of the first voltage signal, (b) the magnitude of the second voltage signal, and (c) a cosine function of a difference between (i) the phase angle of the first voltage signal and (ii) the phase angle of the second voltage signal, as expressed by the example equation below:

$$OperateQuantity = V1_{Magnitude} * V2_{Magnitude} * \cos(V1_{Angle} - V2_{Angle})$$

6

The operate quantity may be compared with a threshold load value. The threshold load value may, for example, correspond to a minimum load current expected within the monitored conductor.

In some examples, a fault indicator subsystem may generate a fault signal to indicate a fault in the monitored conductor based on both (1) the supervisor signal indicating that the first and second voltage signals are valid for the monitored conductor and (2) the sum of the magnitudes of the first and second voltage signals exceeding a fault threshold value. The fault indicator subsystem may, for example, include a differential amplifier to add phase-aligned magnitudes of the first and second voltage signals. The fault indicator subsystem is configured to ignore the first and second voltage signals in response to the supervisor signal indicating that the first and second voltage signals are invalid for the monitored conductor. In some embodiments, the fault indicator subsystem may generate a suspected adjacent-conductor fault signal in response to the supervisor signal indicating that the first and second voltage signals are invalid for the monitored conductor.

The systems and methods described herein may be used in a fault indication system for a three-phase power system. For example, a current sensor may detect a current in a monitored phase line in proximity to an adjacent phase line. Again, the current sensor may include a first Rogowski coil segment (or CT coil segment and resistor combination) to generate a first voltage signal via a first port in response to current induced within the first Rogowski coil segment. The first Rogowski coil segment may be positioned proximate to the monitored phase line in a location that is between the monitored phase line and the adjacent phase line. The current sensor may further include a second Rogowski coil segment to generate a second voltage signal via a second port in response to current induced within the second Rogowski coil segment. The second Rogowski coil segment may be positioned on a second side of the monitored phase line that is opposite the first side of the monitored phase line.

A supervision subsystem evaluates the magnitudes and phase angles of the first and second voltage signals to generate a supervisor signal that indicates that the first and second voltage signals are either valid or invalid for fault detection of the monitored phase line. A fault indicator subsystem generates a fault signal to indicate a fault in the monitored phase line in response to the supervisor signal indicating that the first and second voltage signals are valid and the sum of the magnitudes of the first and second voltage signals exceed a fault threshold value.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order or even sequentially, nor do the steps need to be executed only once unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification, do not necessarily all refer to the same embodiment.

Several aspects of the embodiments disclosed herein may be implemented as software modules. As used herein, a software module may include any type of computer instruction or computer-executable code located within a memory device that is operable in conjunction with appropriate hardware to implement the programmed instructions. A software module may, for instance, comprise one or more physical or logical blocks of computer instructions, which may be organized as a routine, program, object, component, data structure, etc., that performs one or more tasks or implements particular data types.

Embodiments may be provided as a computer program product, including a non-transitory machine-readable medium having stored thereon instructions that may be used to program a computer or other electronic device to perform processes described herein. The non-transitory machine-readable medium may include, but is not limited to, hard drives, ROMs, RAMs, EPROMs, EEPROMs, solid-state memory devices, or other types of machine-readable media suitable for storing electronic instructions. In some embodiments, the computer or another electronic device may include a processing device such as a microprocessor, microcontroller, logic circuitry, or the like. The processing device may further include one or more special-purpose processing devices, such as an application-specific integrated circuit (ASIC), a programmable logic device (PLD), a field programmable gate array (FPGA), or another customizable or programmable device.

FIG. 1A illustrates a perspective diagram 100 of three phase lines that are in close proximity, according to one embodiment. Current traveling through any one of Phase A, Phase B, or Phase C in a direction into the page, as illustrated by the arrow i(t), induces a circular magnetic field B(t) in a clockwise direction, relative to the illustrated perspective.

Figure 1B:
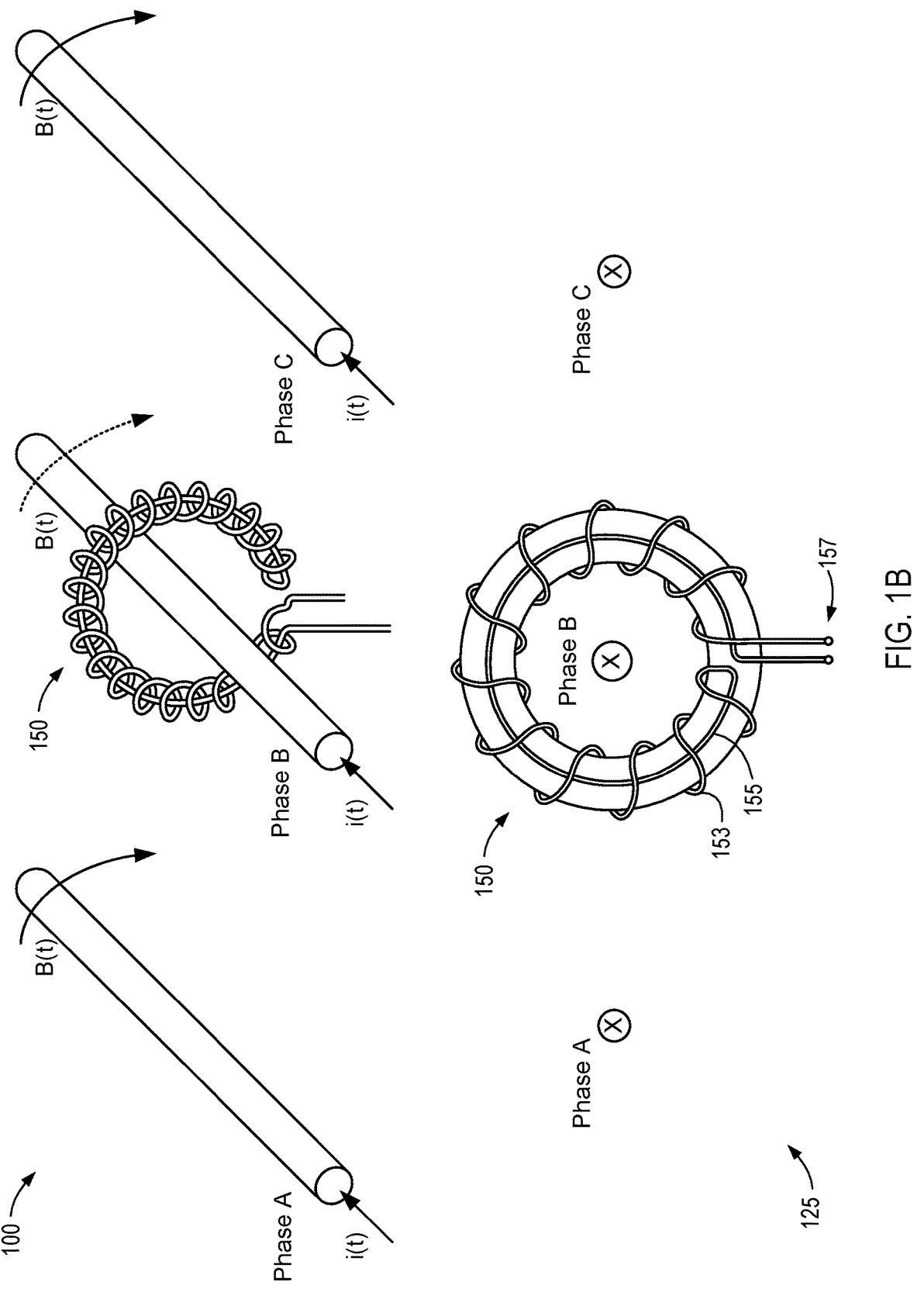
FIG. 1B illustrates the perspective diagram and a two-dimensional view of the three phase lines in close proximity, with a single Rogowski coil around Phase B, according to one embodiment.

FIG. 1B illustrates the perspective diagram 100 and a two-dimensional view 125 of the three phase lines in close proximity, with a single Rogowski coil 150 around Phase B, according to one embodiment. As illustrated in the two-dimensional view 125, the Rogowski coil 150 includes a helical coil 153 of wire wrapped around a non-magnetic core with a center return wire 155. A port 157 is formed by the first terminal connected to the end of the center return wire 155 and the second terminal connected to the end of the helical coil 153.

Figure 1C:
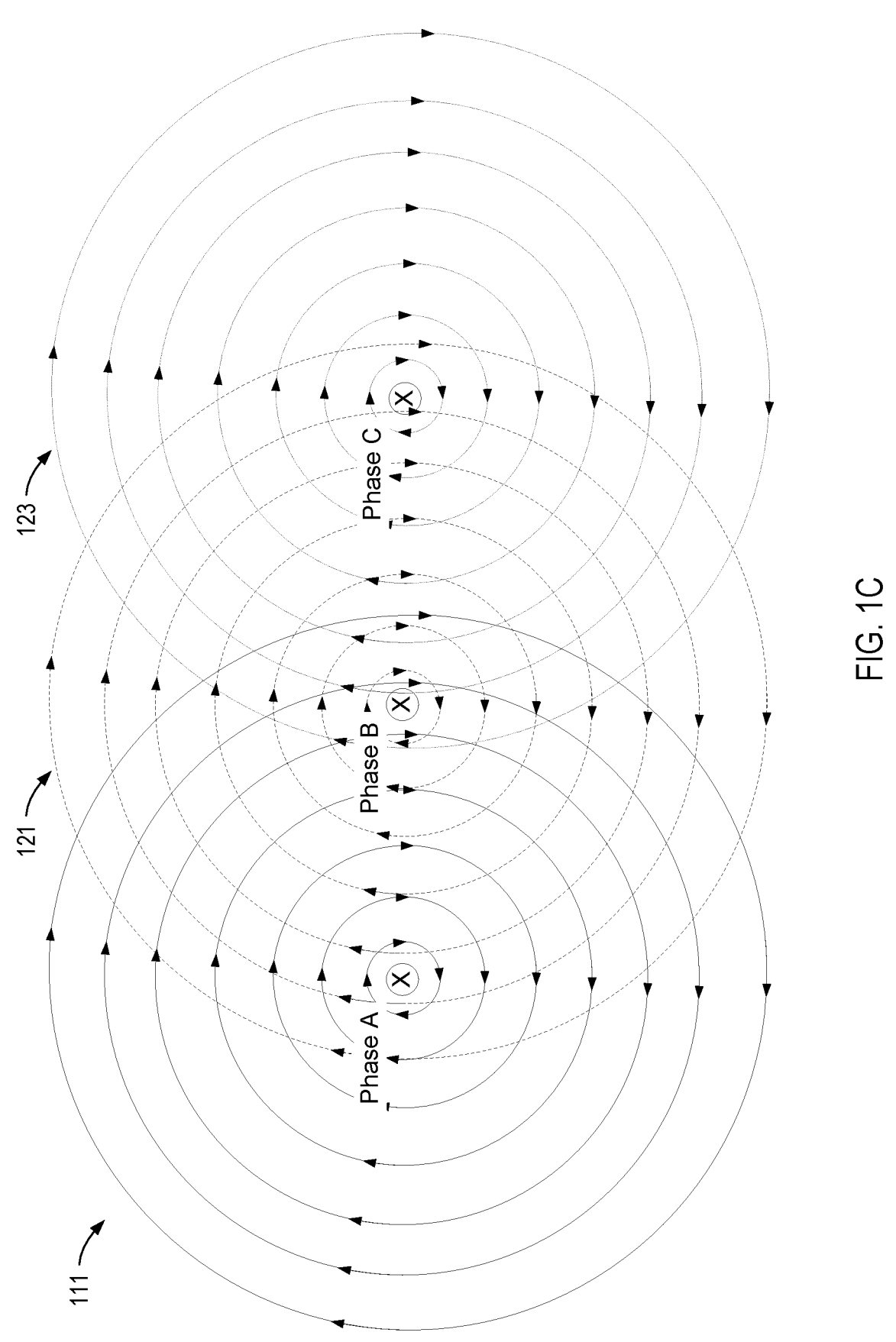
FIG. 1C illustrates the magnetic fields of the three phase lines, according to one embodiment.

FIG. 1C illustrates the magnetic fields 111, 121, and 123 of each of Phase A, Phase B, and Phase C, according to one embodiment. In embodiments in which the three phase lines are relatively far apart, the magnetic fields from one phase line that overlap an adjacent phase line are relatively weak. For example, for applicable current values in embodiments in which the phase lines are 30 centimeters apart (e.g., as in overhead power lines), the magnetic fields proximate to one phase line from an adjacent phase line are relatively weak. In such an embodiment, a current sensor on one phase line may not be compromised by magnetic fields caused by a fault on an adjacent phase line. However, in environments in which the phase lines are in close proximity (e.g., less than 20 centimeters apart, and especially when less than 12 centimeters apart), the magnetic field from a faulted adjacent phase line may compromise the measurements made by a Rogowski coil current sensor on a monitored phase line.

Figure 1D:
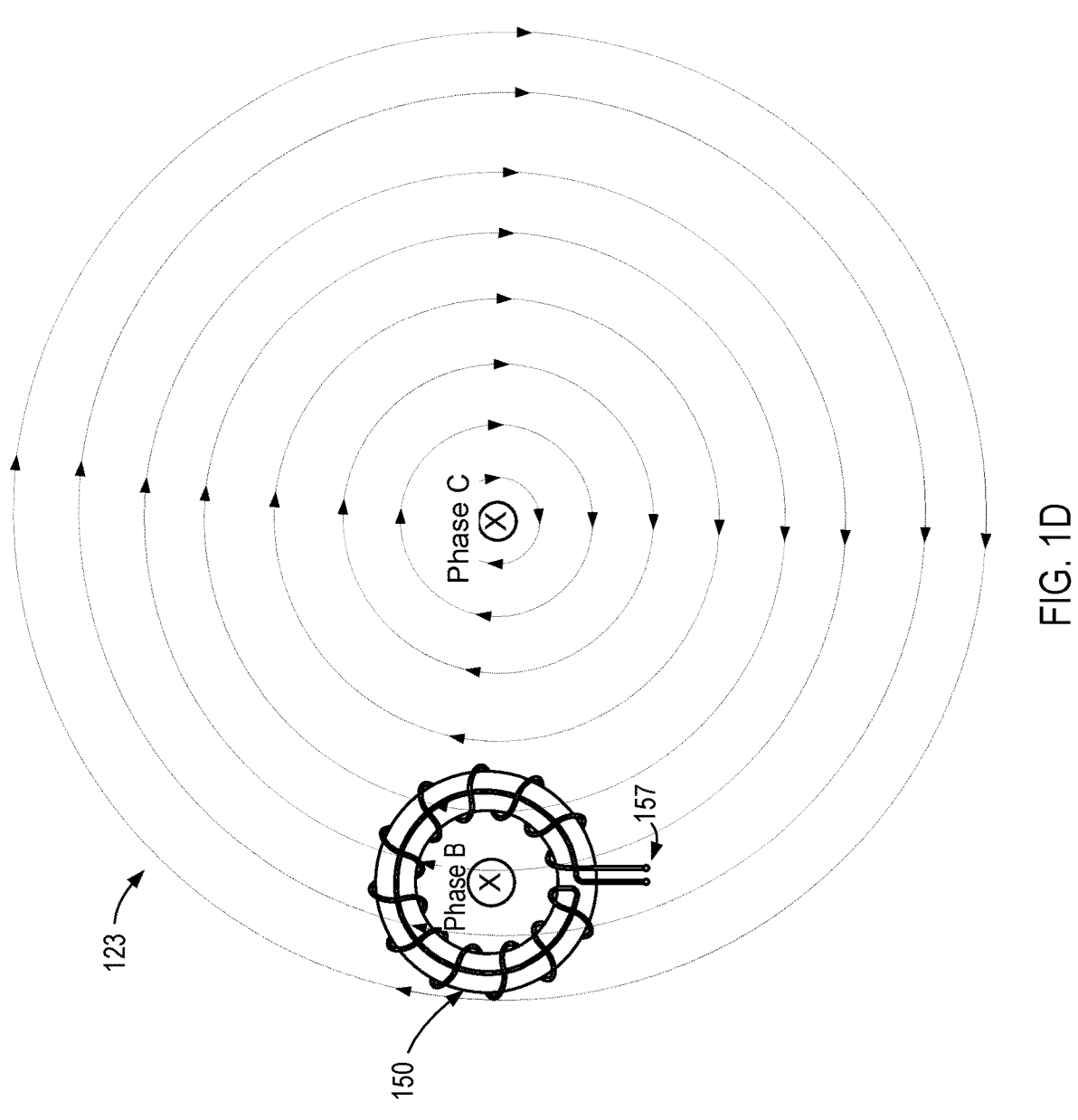
FIG. 1D illustrates magnetic field lines from a faulted phase inducing voltage within a Rogowski coil current sensor on a nearby monitored phase line, according to one embodiment.

FIG. 1D illustrates magnetic field lines 123 from a faulted Phase C inducing current within the Rogowski coil current sensor 150 of monitored Phase B, according to one embodiment. As illustrated, the single port 157 of the single Rogowski coil 150 will generate a voltage signal in response to induced currents from both Phase B and faulted Phase C. As such, the values from port 157 are invalid for measuring the current within Phase B due to the strength of the magnetic field 123 generated by the faulted Phase C.

Figure 2A:
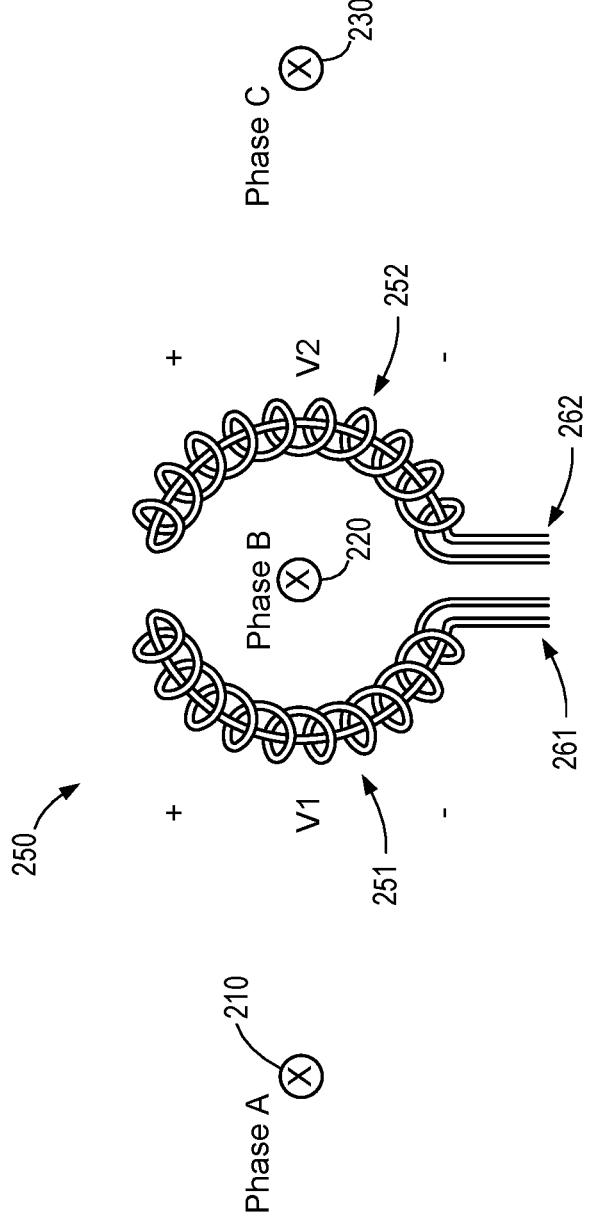
FIG. 2A illustrates an example of a multiport current sensor with multiple Rogowski coil segments, according to one embodiment.

FIG. 2A illustrates the three phase lines with a multiport current sensor 250 with two independent Rogowski coil segments 251 and 252 to measure the current of Phase B 220 (the monitored phase), according to one embodiment. As long as the current within Phase A 210 and Phase C 230 is within normal operating range, the multiport current sensor 250 can measure the current within Phase B 220 with suitable accuracy for fault detection, where measured current values in excess of a fault detection threshold correspond to a fault on Phase B 220. However, a fault on Phase C 230 may generate magnetic fields that induce currents within the multiport current sensor 250 that compromise the ability of the multiport current sensor 250 to accurately detect faults on Phase B 220.

As described herein, the multiport current sensor 250 utilizes two independent Rogowski coil segments 251 and 252 to allow for the detection and rejection of adjacent-phase faults. In the illustrated embodiment, the multiport current sensor 250 includes the first Rogowski coil segment 251 connected to a first coil segment port 261 that is completely independent of the second Rogowski coil segment 252 that is connected to a second coil segment port 262.

Figure 2B:
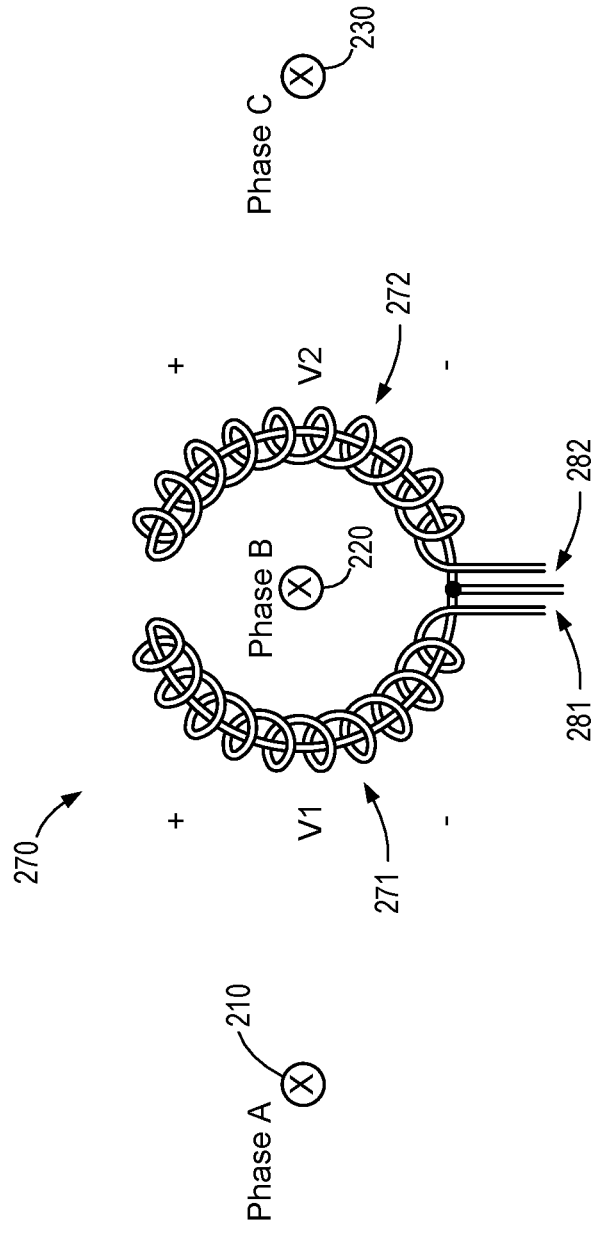
FIG. 2B illustrates another example of a multiport current sensor with multiple Rogowski coil segments, according to one embodiment.
Figure 2B:

FIG. 2B illustrates the three phase lines with a multiport current sensor 270 that includes two Rogowski coil segments 271 and 272 that share a common "center-tapped" terminal on a return line of the helical coils, according to one embodiment. As illustrated, a first port 281, associated with the first Rogowski coil segment 271, is connected to a center tap on a common return line. A second port 282 is also connected to the center tap on the common return line of the second Rogowski coil segment 272.

Figures 2C, 2D:
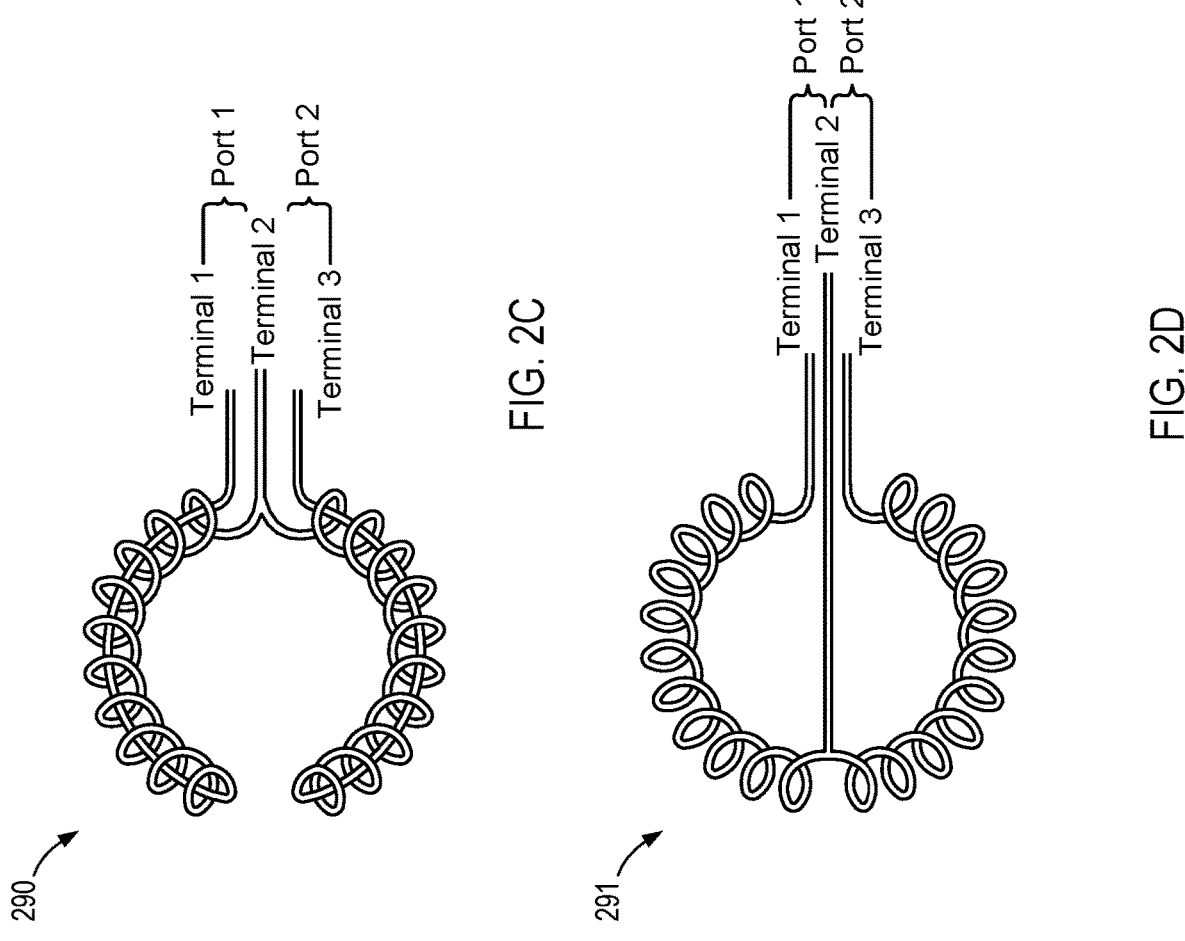
FIG. 2C illustrates another example of a multiport current sensor with multiple Rogowski coil segments, according to one embodiment.
FIG. 2D illustrates another example of a multiport current sensor with multiple Rogowski coil segments, according to one embodiment.

FIG. 2C illustrates another example of a multiport current sensor 290 in which the first and second ports share a common connection (Terminal 2) to connected helical coils, according to one embodiment. The other terminal (Terminal 1) of the first port is connected to a return line of the first helical coil, and the other terminal (Terminal 3) of the second port is connected to a return line of the second helical coil.

FIG. 2D illustrates another example of a multiport current sensor 291 in which the first and second ports share a common connection to a center tap on a continuous helical coil, according to one embodiment. In the illustrated example, each Rogowski coil segment comprises a portion of the single helical coil, and there are no center return lines. As such, the other terminals of the first and second ports are connected to the ends of the single continuous helical coil.

Figure 3:
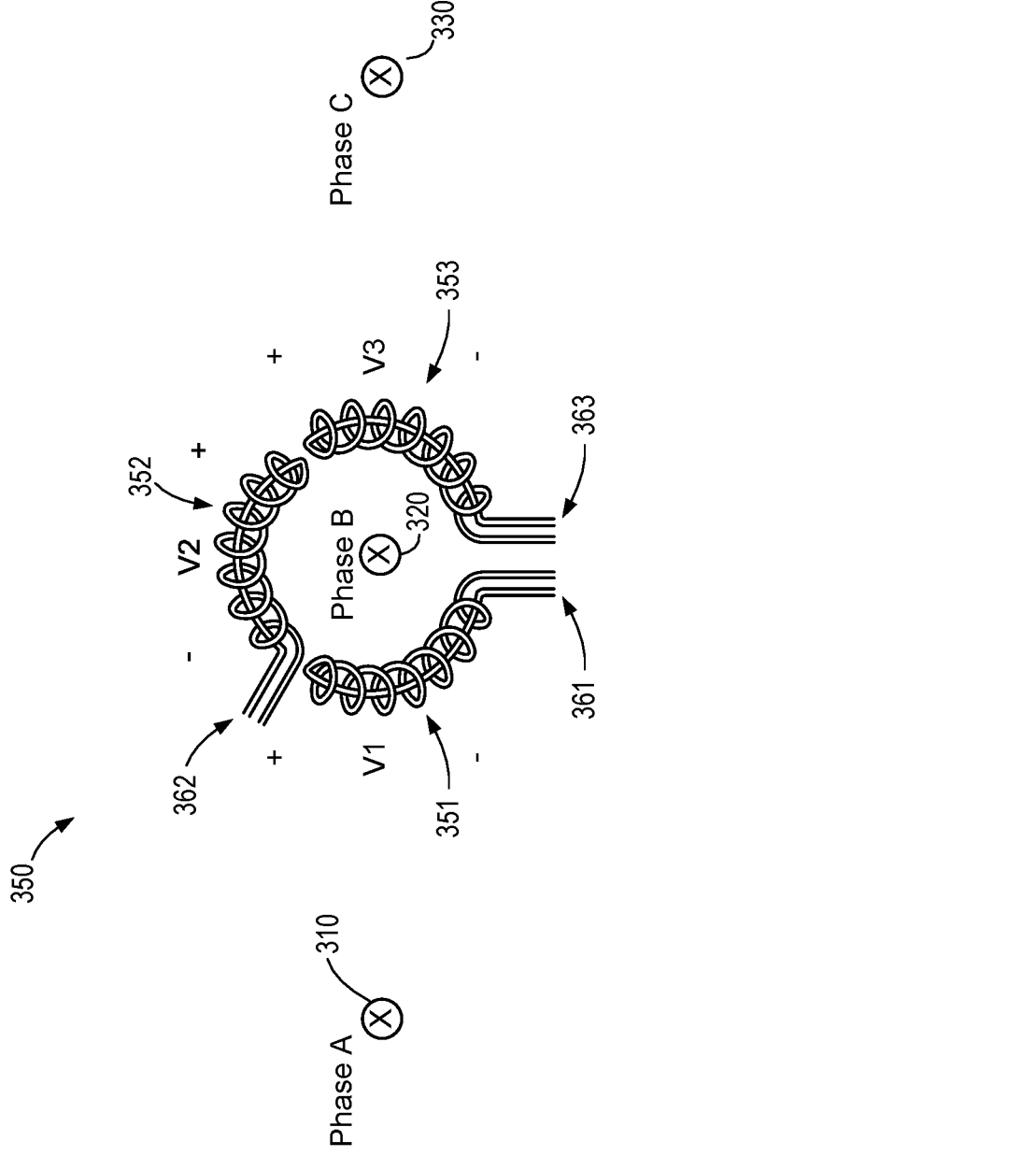
FIG. 3 illustrates an example of a multiport current sensor that includes three Rogowski coil segments, according to one embodiment.

FIG. 3 illustrates an example of a multiport current sensor 350 that includes three Rogowski coil segments 351, 352, and 353 and three independent ports 361, 362, and 363, according to one embodiment. As illustrated, the three-segment multiport current sensor 350 is positioned around Phase B 320 to monitor currents therein (e.g., for fault detection). Phase B 320 is in relatively close proximity to Phase A 310 and Phase C 330, such that a fault on either Phase A 310 or Phase C 330 might normally compromise the ability of a single Rogowski coil current sensor to accurately detect a fault on the monitored Phase B 320. As described in detail herein, the independent signals from each of the three independent ports 361, 362, and 363 allow for the detection, rejection, and/or filtering of magnetic fields and induced current from the adjacent Phase A 310 and Phase C 330.

Figure 4:
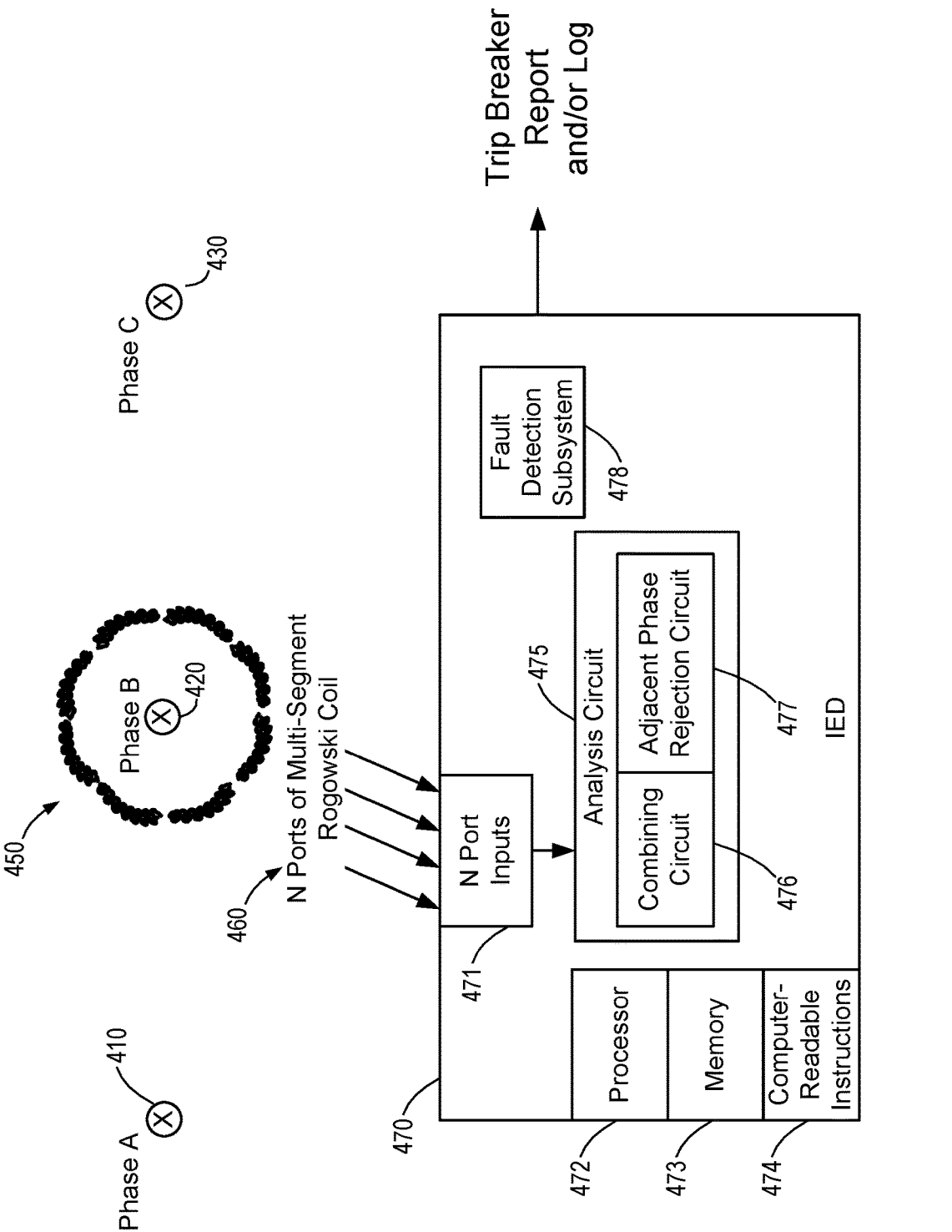
FIG. 4 illustrates an example of a multiport current sensor with multiple Rogowski coil segments in communication with an intelligent electronic device (IED), according to one embodiment.

FIG. 4 illustrates an example of a multiport current sensor 450 with multiple Rogowski coil segments in communication with an intelligent electronic device (IED) 470, according to one embodiment. The multiport current sensor 450 may include any number of (N) Rogowski coil segments that are completely independent of one another and/or that share common or "tapped" center return lines and/or common or "tapped" helical coils. The number of Rogowski coil segments and corresponding ports 460 may be represented by N, where N is an integer value. The multiport current sensor 450 may be configured to monitor current and/or detect faults on the monitored Phase B 420, which is in close proximity to Phase A 410 and Phase C 430. The IED 470 may receive the voltage signals from the ports 460 and analyze them to reject, filter, and/or otherwise detect and respond to currents induced within the multiple Rogowski coil segments of multiport current sensor 450 by fault currents within Phase A 410 and/or Phase C 430.

As illustrated, the IED 470 may include an input 471 to receive the signals from the N ports 460 of the multiport current sensor 450. In some embodiments, the IED 470 may include a processor 472, a memory 473, and/or computer-readable instructions 474 stored within a non-transitory storage medium (e.g., a hard drive). In some embodiments, one or more of the functions, operations, subsystems, or modules described herein may be implemented by the processor 472 executing instructions within the memory 473. In other embodiments, the various functions, operations, and/or subsystems may be implemented by discrete circuit components, application-specific integrated circuits, and/or programmable logic devices.

For example, an analysis circuit 475 may operate to detect faults on the monitored Phase B 420 and reject (e.g., filter, ignore, etc.) currents induced by faults on the adjacent Phase A 410 or adjacent Phase C 430. The analysis circuit 475 may include a combining circuit 476 and an adjacent phase rejection circuit 477. According to various embodiments, the combining circuit 476 may add phase-aligned magnitudes of the voltage signals from the coil segment ports 460 of the multiple Rogowski coil segments to produce an output signal corresponding to the magnitude of a current in the monitored phase line (Phase B 420). For example, the combining circuit 476 may include one or more differential amplifiers to add phase-aligned magnitudes of the voltage signals from the coil segment ports 460. In a specific embodiment in which the number of Rogowski coil segment ports 460 is two, a single differential amplifier may operate to subtract the inverted magnitude of the signal from a first port connected to a first Rogowski coil section from the non-inverted magnitude of the signal from a second port connected to a second Rogowski coil section, where the first and second ports are interchangeable and may be treated as the "first" or "second" port based on which corresponding Rogowski coil segment is closer to the faulted phase line. In some embodiments, each Rogowski coil segment is associated with a discrete or individual integrator device, such that the voltage signals provided by the ports 460 represent time-integrated values, as understood by those of skill in art using Rogowski current sensors.

According to various embodiments, the adjacent phase rejection circuit 477 may be implemented as a discrete circuit, by a processor configured to execute program instructions, and/or via a programmable logic device. The adjacent phase rejection circuit 477 may operate to compare the magnitudes and phase angles of the voltage signals from the coil segment ports 460 to detect that a fault in at least one of the adjacent phase lines (Phase A 410 or Phase C 430) is affecting the output signal of the combining circuit 476 by more than a threshold amount. In some embodiments, the adjacent phase rejection circuit 477 generates a flag signal to indicate the detection of the adjacent-phase fault and/or an adjacent-conductor fault.

In some embodiments, the adjacent phase rejection circuit 477 includes or is implemented in part by a microprocessor to compare the magnitudes and unaligned phase angles of the voltage signals from the coil segment ports 460 to determine a relative location of a magnetic field source. In some embodiments, the adjacent phase rejection circuit 477 may include a first-stage summing amplifier to sum the unaligned magnitudes of the signals from the first port and the second port. The adjacent phase rejection circuit 477 may also include a comparator circuit to detect the adjacent-conductor fault and generate the flag signal in response to the output of the first stage summing amplifier exceeding a comparison threshold value.

The IED 470 may include a fault detection subsystem 478 that operates to receive the output signal from the combining circuit 476 and the flag or adjacent-phase fault signal from the adjacent phase rejection circuit 477 of the analysis circuit 475. The fault detection subsystem 478 may generate a fault signal indicating a fault on the monitored conductor in response to the output signal exceeding a fault threshold value, except when the flag or adjacent-phase fault signal indicates that the measured values may be invalid due to an adjacent phase fault. As such, the fault detection subsystem 478 may operate to ignore the fault signal in response to the flag signal indicating the detection of the fault in the adjacent conductor. The fault detection subsystem 478 may operate to trip a breaker, report a detected fault on the monitored phase line, report a detected adjacent-phase fault, and/or log and report the measurement values for another system, device, or person to evaluate.

Figure 5A:
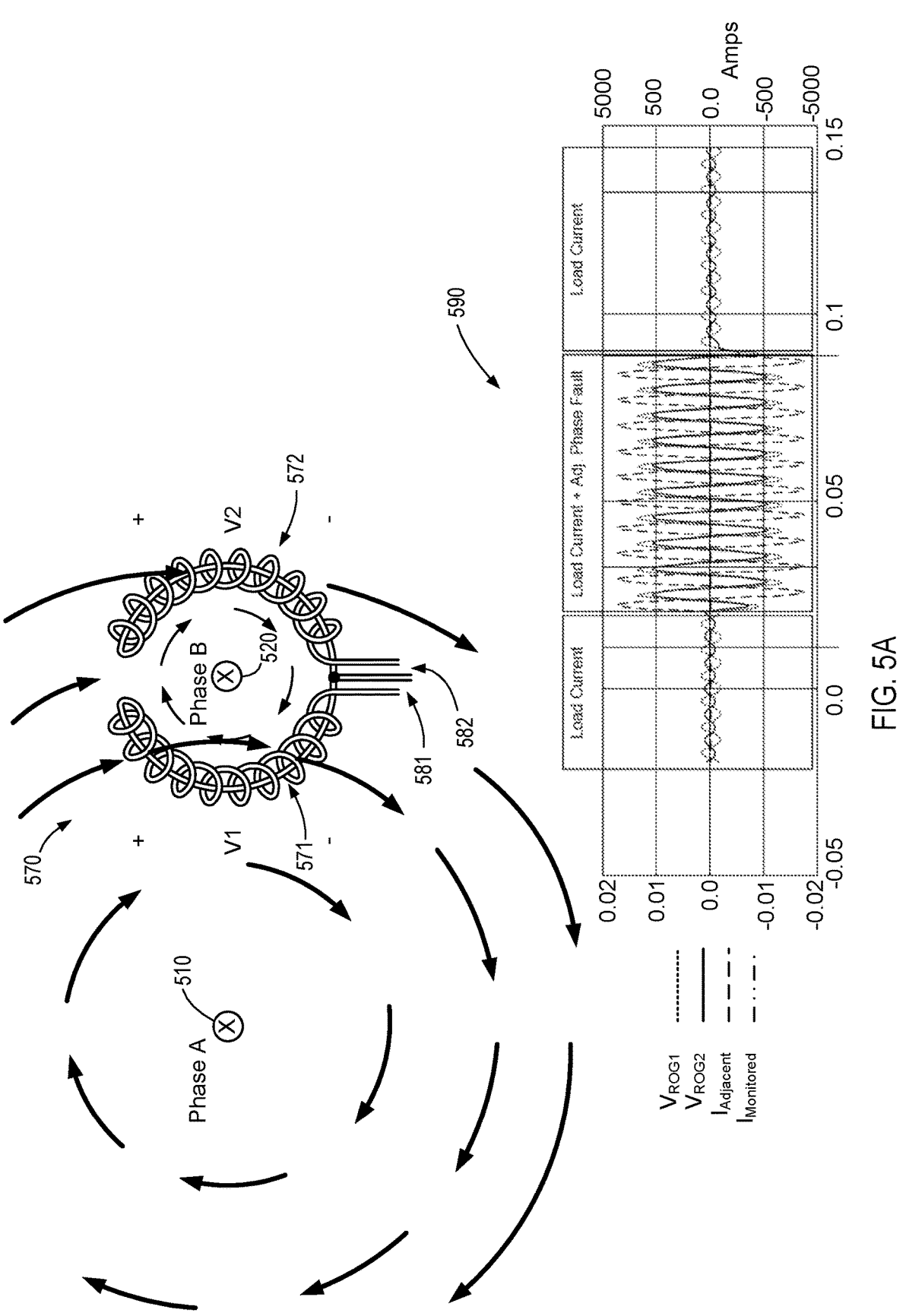
FIG. 5A illustrates a block diagram and graphical depictions of voltage induced in a multiport current sensor by an adjacent phase fault, according to one embodiment.
Figure 5B:
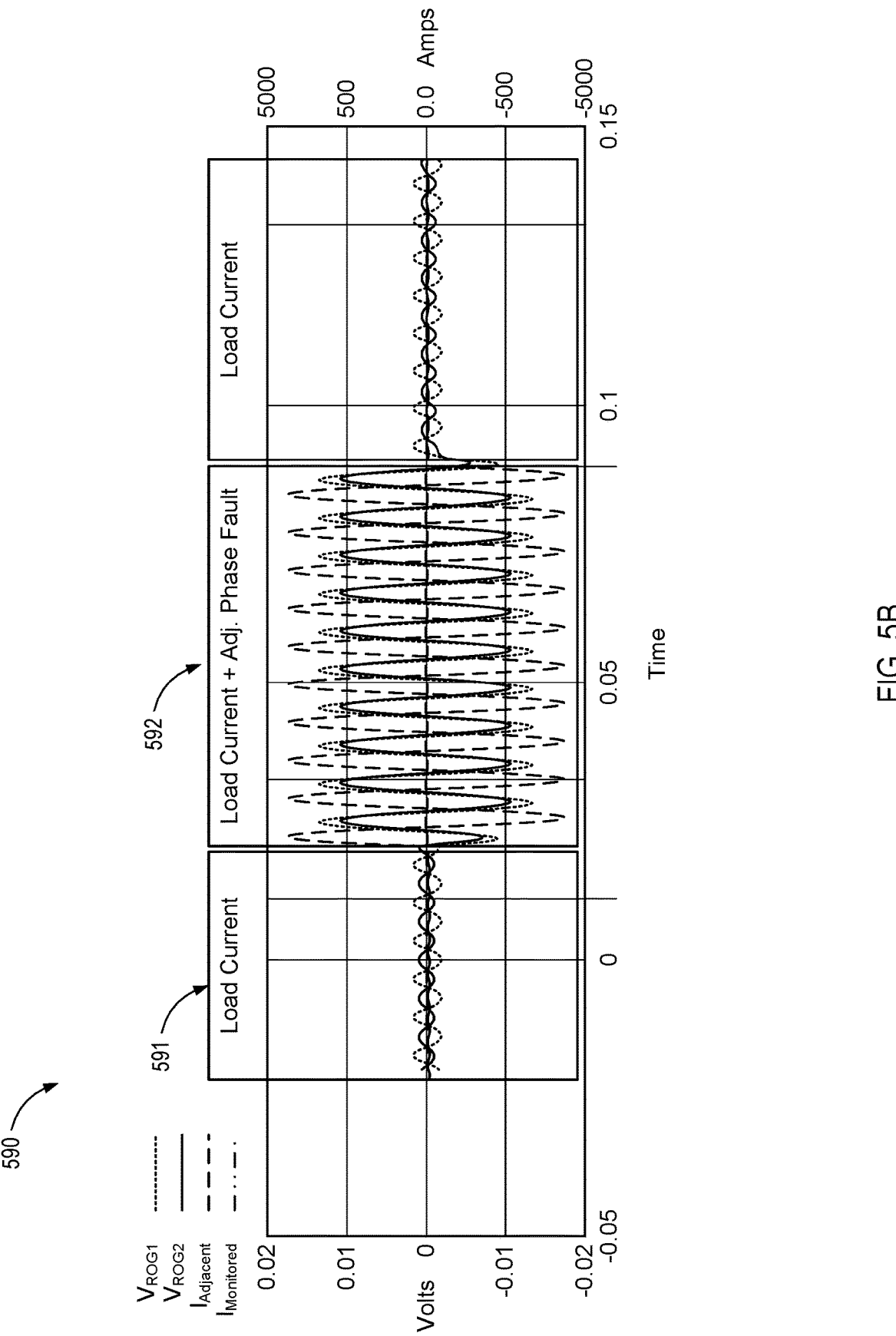
FIG. 5B illustrates a larger version of the graphical depictions of current and voltage measurements, according to one embodiment.

FIG. 5A illustrates a block diagram and graphical depictions of current induced in a multiport current sensor 570 by an adjacent phase fault, according to one embodiment. FIG. 5B illustrates a larger version of the graphical depictions of the current and voltage readings and is referred to together with FIG. 5A. In the illustrated embodiment, the multiport current sensor 570 includes a first port 581 that is connected to a first Rogowski coil segment 571 and a second port 582 that is connected to a second Rogowski coil segment 572.

In the illustrated block diagram, current from the monitored Phase B 520 creates a magnetic field that rotates in the clockwise direction, such that the current induced on the first Rogowski coil segment 571 is 180 degrees out of phase with respect to the current induced on the second Rogowski coil segment 572. A first portion 591 of a graph 590 illustrates the voltage from the first Rogowski coil segment 571 and the voltage from the second Rogowski coil segment 572 are 180 degrees out of phase and correspond to the minimal amount of current depicted on the monitored phase line (Phase B 520).

The fault on Phase A 510 induces a magnetic field that rotates in the clockwise direction, such that the current induced on the first Rogowski coil segment 571 is substantially in phase with respect to the current induced on the second Rogowski coil segment 572. The second portion 592 of the graph 590 illustrates the changes in the voltages measured by the first Rogowski coil segment 571 and the second Rogowski coil segment 572 affected by the relatively large current on the adjacent phase (Phase A 510). During normal load conditions, the first Rogowski coil segment 571 and the second Rogowski coil segment 572 detected the load current of the monitored phase (Phase B 520) 180 degrees out of phase with respect to the common center tap. When an adjacent phase fault occurs, the induced currents in the first Rogowski coil segment 571 and the second Rogowski coil segment 572 cause the voltage signals output by the corresponding ports 581 and 582 to appear in phase with one another. As described herein, the presently described systems and methods may be used to ignore detected fault currents when adjacent-phase faults are detected, filter out the effects of the adjacent-phase fault, and/or otherwise implement an adjacent-phase rejection scheme.

Figure 6A:
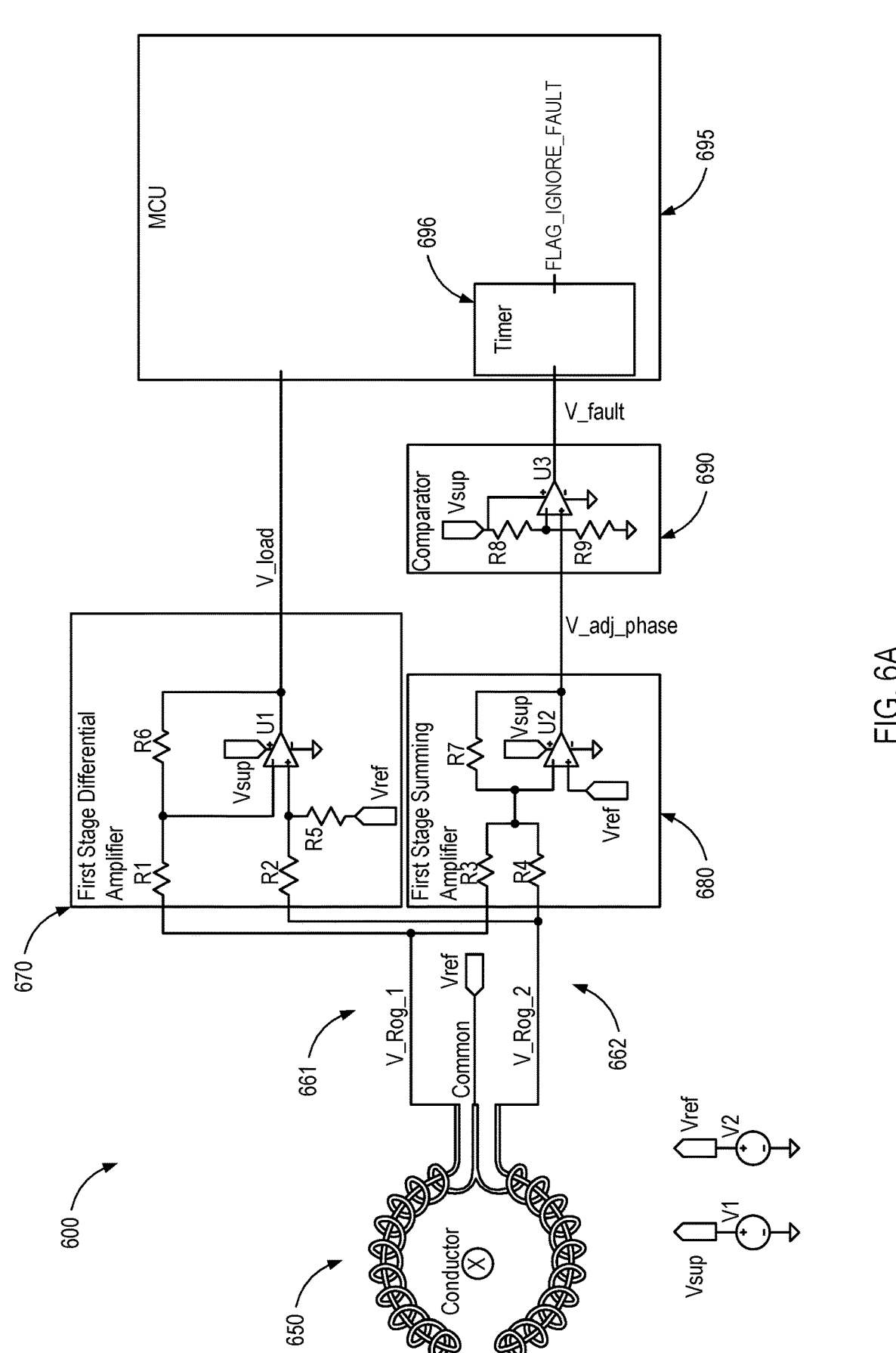
FIG. 6A illustrates an example diagram of an analysis circuit to distinguish between load current and adjacent phase fault current.
Figure 6B:
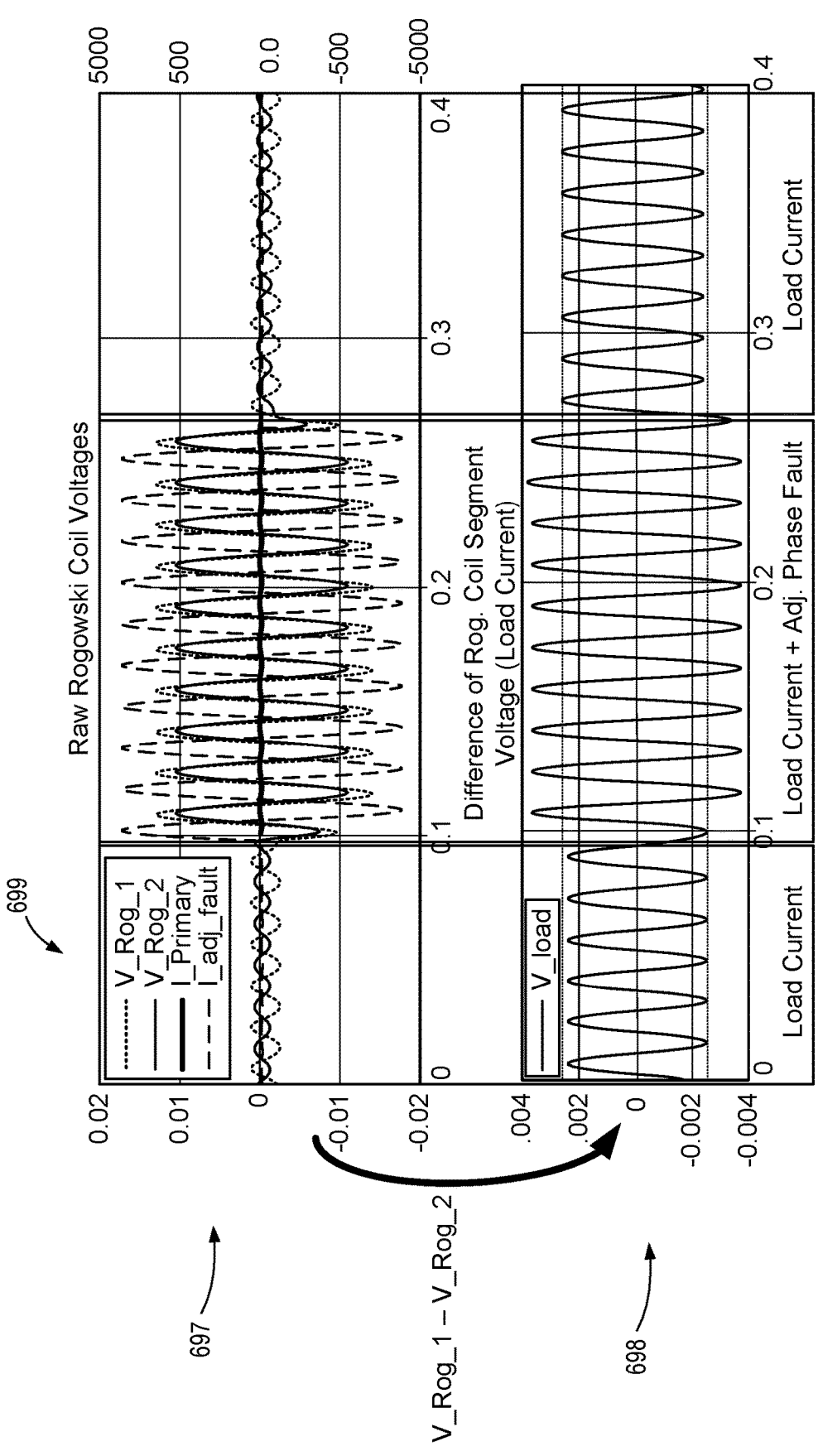
FIG. 6B illustrates graphical depictions of the operation of the circuit, according to one embodiment.

FIG. 6A illustrates an example diagram of an analysis circuit 600 to distinguish between load current and adjacent phase fault current. FIG. 6B illustrates graphical depictions 697 and 698 of the operation of the circuit 600. In the illustrated example, the circuit 600 includes a differential amplifier 670 to measure load current. The circuit 600 also includes a summing amplifier 680, comparator 690, and a timer 696 to flag an adjacent phase fault.

During normal load current conditions, the differential amplifier 670 subtracts the voltage values from a first Rogowski coil segment 661 of a center-tapped multiport Rogowski current sensor 650 from the voltage values of a second Rogowski coil segment 662. As these values are 180 degrees out of phase, the two voltages are added together to generate a voltage value corresponding to the load current on the measured phase line, as depicted in the first column 699 of the graphical depictions 697 and 698.

It is appreciated that there is some contribution from an adjacent phase that appears in the added voltages output by the differential amplifier 670 since the first Rogowski coil segment 661 may be closer to a faulted adjacent phase line than the second Rogowski coil segment 662. The first stage summing amplifier 680 and comparator 690 operate to detect the impact of induced currents from a faulted adjacent phase line. If the impact is above a threshold value, then a flag indicating an adjacent-phase fault may be generated for a period of time (e.g., via timer 696). The processing unit 695 may ignore the voltage values from the differential amplifier 670, at least for purposes of fault detection, until the flag is removed (e.g., an adjacent-phase fault is no longer detected).

Figure 7:
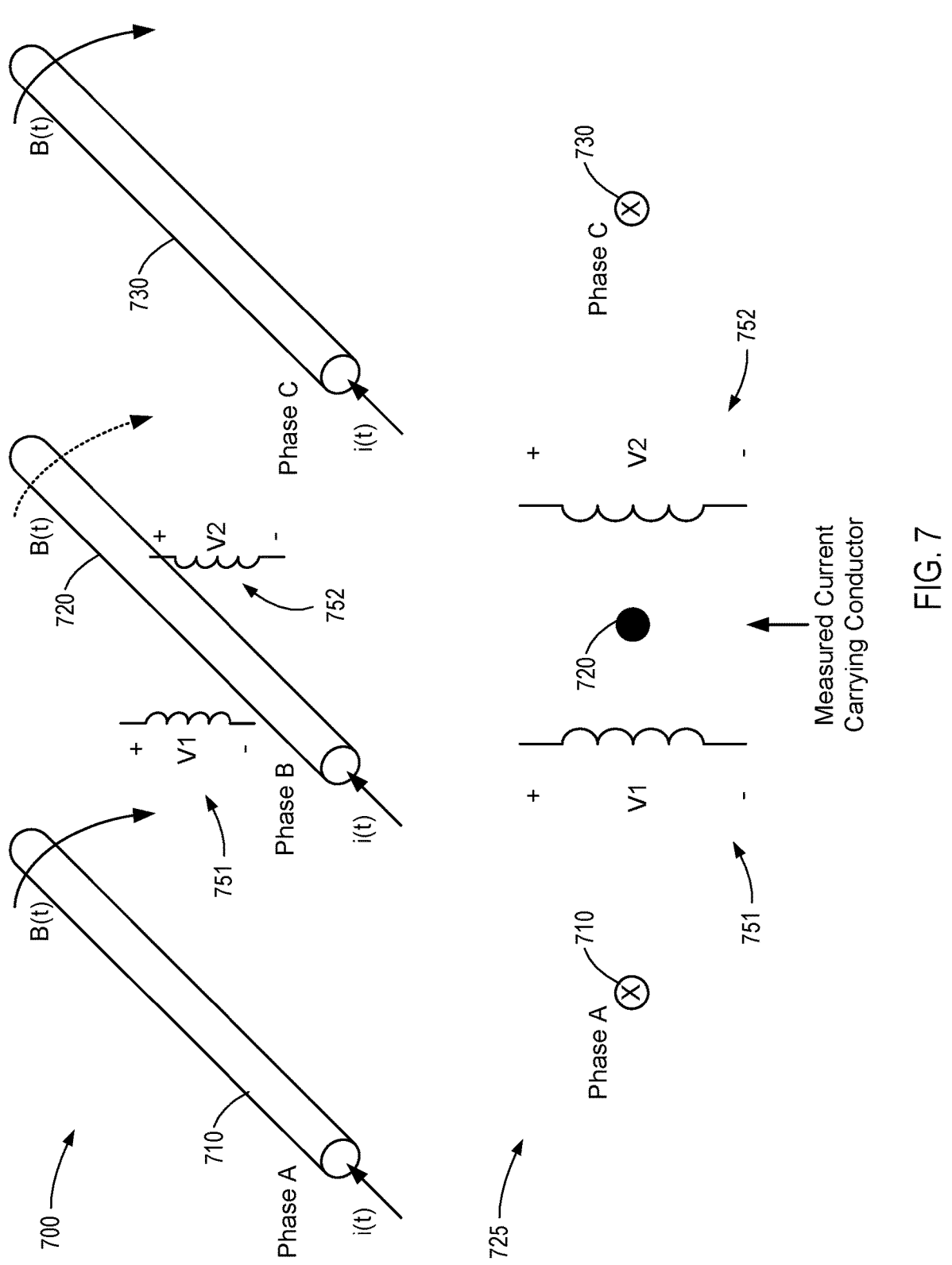
FIG. 7 illustrates perspective and two-dimensional views of three phase lines in which multiple Rogowski current segments are used to monitor a conductor, according to one embodiment.

FIG. 7 illustrates a perspective view 700 and a two-dimensional view 725 of three phase lines of a three-phase power system in which multiple Rogowski current segments are used to monitor one conductor, according to one embodiment. As illustrated, a current sensor may be formed as a first Rogowski coil segment 751 to generate a first voltage signal via a first port and a second Rogowski coil segment 752 to generate a second voltage signal via a second port. As illustrated, the first Rogowski coil segment 751 may be positioned proximate to a monitored conductor 720 in a location that is between the monitored conductor 720 and an adjacent conductor 710. The second Rogowski coil segment 752 is positioned on a second side of the monitored conductor 720 that is opposite the first side of the monitored conductor 720, and farther from the adjacent conductor 710.

In a three-phase power system, a third conductor 730 may also be present. As illustrated, each of the first and second Rogowski coil segments 751 and 752 may be straight segments that are positioned on opposing sides of the monitored conductor 720. In other embodiments, the Rogowski coil segments 751 and 752 may be curved or rounded to form a ring or other shape that generally encompasses all or a portion of the monitored conductor 720.

Figure 8:
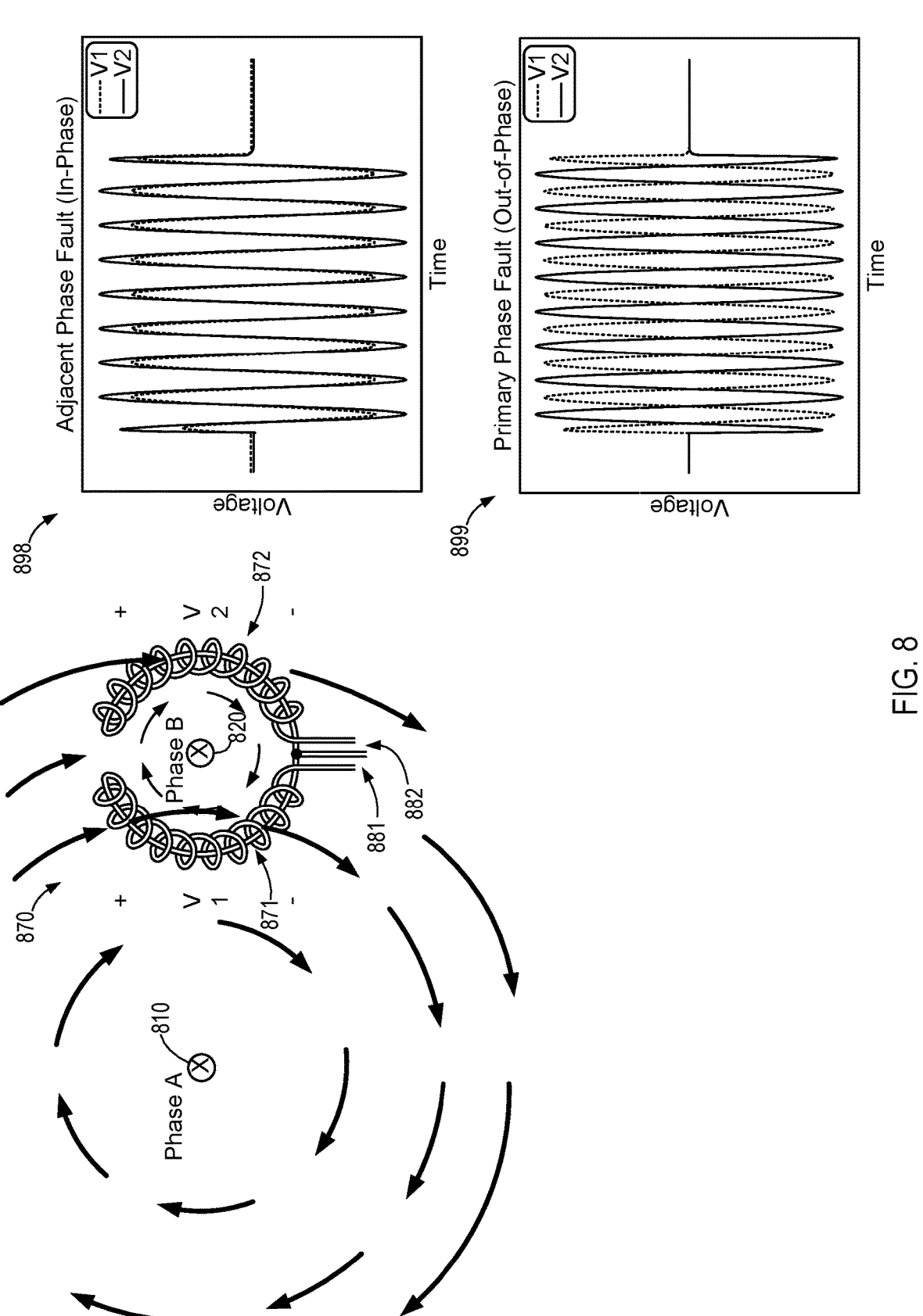
FIG. 8 illustrates a block diagram and graphical depictions of current induced in a multiport current sensor by an adjacent phase fault, according to one embodiment.

FIG. 8 illustrates another block diagram and graphical depictions of current induced in a multiport current sensor 870 by an adjacent phase fault, according to one embodiment. In the illustrated embodiment, the multiport current sensor 870 includes a first port 881 that is connected to a first Rogowski coil segment 871 and a second port 882 that is connected to a second Rogowski coil segment 872.

Current from a monitored conductor 820 creates a magnetic field that rotates in the clockwise direction, such that the current induced on the first Rogowski coil segment 871 is 180 degrees out of phase with respect to the current induced on the second Rogowski coil segment 872. The bottom graph 899 illustrates that the voltage from the first Rogowski coil segment 871 and the voltage from the second Rogowski coil segment 872 are each 180 degrees out of phase.

The fault on the adjacent conductor 810 induces a magnetic field that rotates in the clockwise direction, such that the current induced on the first Rogowski coil segment 871 is substantially in phase with respect to the current induced on the second Rogowski coil segment 872. The upper graph 898 illustrates the voltages measured by the first Rogowski coil segment 871 and the second Rogowski coil segment 872 due to the adjacent-phase fault on the adjacent conductor 810. The presently described systems and methods may be used to ignore detected fault currents when adjacent-phase faults are detected, filter out the effects of the adjacent-phase fault, and/or otherwise implement an adjacent-phase rejection scheme.

Figure 9:
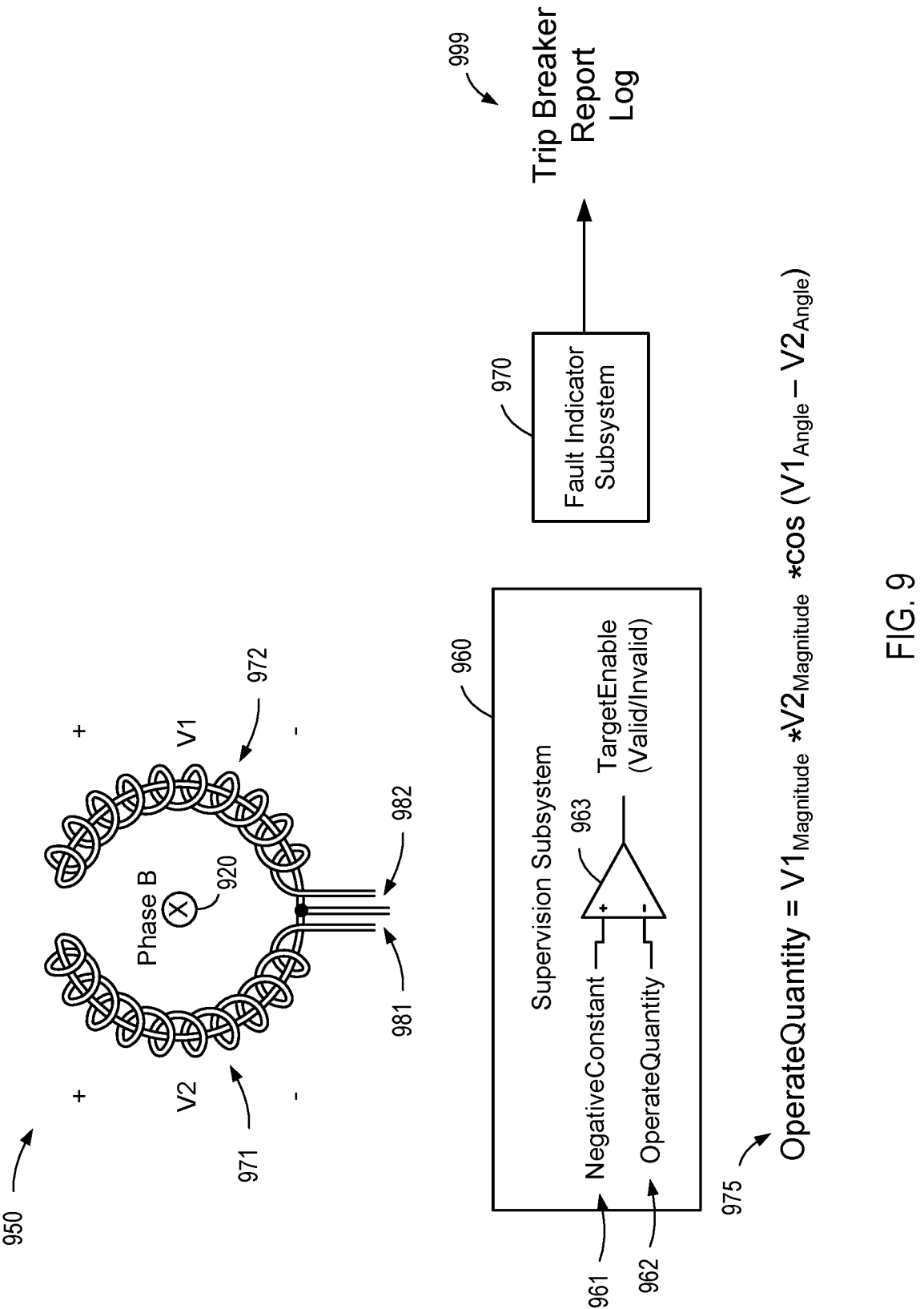
FIG. 9 illustrates an example of a multiport current sensor with multiple Rogowski coil segments in communication with a supervision subsystem, according to one embodiment.

FIG. 9 illustrates an example of a multiport current sensor 950 with multiple Rogowski coil segments in communication with a supervision subsystem 960. The multiport current sensor 950 may, for example, include a first Rogowski coil segment 971 to generate a voltage signal in response to induced currents via a first port 981. The multiport current sensor 950 may also include a second Rogowski coil segment 972 to generate a voltage signal in response to induced currents via a second port 982. The first and second ports 981 and 982 may share a common center-tapped return wire (as illustrated) or be fully independent. In other embodiments, more than two Rogowski coil segments and ports may be utilized.

The supervision subsystem 960 may evaluate magnitudes and phase angles of the first and second voltage signals from the first and second ports 981 and 982 to generate a supervisor signal that indicates that the first and second voltage signals are either valid or invalid (e.g., generate a flag or supervisor signal). For example, the supervision subsystem 960 may indicate that the measurements from the multiport current sensor 950 are invalid for fault detection of the monitored conductor 920 in response to a determination that the current in an adjacent conductor is inducing currents within the first and second Rogowski coil segments 971 and 972 that exceed a threshold value.

Similarly, the supervision subsystem 960 may indicate that the measurements from the multiport current sensor 950 are valid for fault detection of the monitored conductor 920 in response to a determination that the current in an adjacent conductor does not exist or is inducing currents within the first and second Rogowski coil segments 971 and 972 that are less than a threshold value.

A fault indicator subsystem 970 may generate a fault signal to indicate a fault in the monitored phase conductor 920 in response to the supervisor signal indicating that the first and second voltage signals are valid and that the sum of the magnitudes of the first and second voltage signals exceed a fault threshold value. The fault signal may be used as an input into a fault response system, used to trip a breaker, used to update a report, and/or logged, at 999. In some embodiments, the fault indicator subsystem 970 may include or utilize a differential amplifier to add phase-aligned magnitudes of the first and second voltage signals from the first and second ports 981 and 982.

In various embodiments, the multiport current sensor 950 may be positioned such that the distance between the monitored conductor 920 and the first Rogowski coil segment 971 is approximately equal to the distance between the monitored conductor 920 and the second Rogowski coil segment. As depicted in other figures, the distance between an adjacent conductor and the first Rogowski coil segment 971 may be less than the distance between the adjacent conductor and the second coil segment 972 or vice versa.

The supervision subsystem 960 may evaluate the magnitudes and phase angles of the voltages from the first and second ports 981 and 982 using a differential amplifier 963 to compare a negative constant value 961 with a calculated operate quantity 962. As depicted, the operate quantity 962 may be calculated, at 975, as a product of (a) the magnitude of the first voltage signal, (b) the magnitude of the second voltage signal, and (c) a cosine function of a difference between (i) the phase angle of the first voltage signal and (ii) the phase angle of the second voltage signal, as expressed by the following equation:

$$\text{OperateQuantity} = V1_{Magnitude} * V2_{Magnitude} * \text{COS} (V1_{Angle} - V2_{Angle})$$

As illustrated, the operate quantity 962 may be compared with a threshold load value that is a negative constant value 961, representative of a minimum load current expected within the monitored conductor 920. When there is significantly more current in an adjacent phase conductor compared to the measured conductor 920, the scalar operate quantity 962 is positive resulting in blocking of the multiport current sensor 950 for targeting of the adjacent phase fault. When the current through the measured conductor 920 is roughly equal to or greater than the fault current in an adjacent phase conductor, the scalar operate quantity 962 is a negative number. This negative number grows in magnitude in the negative direction as the current in the measured conductor 920 increases, which enables the targeting of the multiport current sensor 950 based on the output of the supervision subsystem 960 indicating that the measured values are valid for fault detection. Utilizing the phase angle comparison-based algorithm described herein in conjunction with a multiport current sensor 950 that includes two Rogowski coil segments 971 and 972 provides greater immunity for higher adjacent phase currents in closer proximity to the sensor as compared to other solutions.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope and understanding of this disclosure should, therefore, be determined to encompass at least the following claims.

The invention claimed is:

1. A multiport current sensor to measure current, comprising:
    multiple coil segments arranged end-to-end to form at least a portion of a closed loop to be positioned around a monitored phase line such that each coil segment is positioned in a different location relative to at least one adjacent phase line,
    wherein each coil segment generates a voltage signal via an individual coil segment port in response to induced current;
    a combining circuit to phase-align the voltage signals from the coil segment ports to a common phase reference and to add magnitudes of the phase-aligned voltage signals to produce an output signal corresponding to a magnitude of a current in the monitored phase line; and
    an adjacent phase rejection circuit to compare, between the voltage signals from the coil segment ports, (i) respective magnitudes and (ii) respective phase angles to detect that a fault in an adjacent phase line is affecting the output signal of the combining circuit by more than a threshold amount.

2. The multiport current sensor of claim 1, wherein the adjacent phase rejection circuit is configured to generate a flag signal indicating the detection of the fault in the adjacent phase line.

3. The multiport current sensor of claim 1, wherein each coil segment comprises a segment of a current transformer (CT) and a resistor.

4. The multiport current sensor of claim 1, wherein each coil segment comprises a Rogowski coil segment.

5. The multiport current sensor of claim 4, wherein each Rogowski coil segment comprises a helically coiled wire with a center return.

6. The multiport current sensor of claim 4, wherein each Rogowski coil segment has a curved crescent shape, and the multiple Rogowski coil segments are arranged to form at least a portion of a circle to be positioned around the monitored phase line.

7. The multiport current sensor of claim 4, wherein each Rogowski coil segment is straight, and the multiple Rogowski coil segments are arranged to form at least a portion of a rectangle to be positioned around the monitored phase line.

8. The multiport current sensor of claim 4, wherein the multiple Rogowski coil segments comprise two Rogowski coil segments, and wherein the two Rogowski coil segments are configured to be positioned on opposing sides of the monitored phase line.

9. The multiport current sensor of claim 1, wherein at least two of the multiple coil segments are configured to be positioned with portions of at least two coil segments at least partially overlapping one another.

10. The multiport current sensor of claim 1, wherein the coil segment ports of each coil segment share a common terminal, such that the total number of terminals is equal to one more than the number of coil segments.

11. The multiport current sensor of claim 1, wherein the combining circuit comprises:
    one or more differential amplifiers to add phase-aligned magnitudes of the voltage signals from the coil segment ports.

12. The multiport current sensor of claim 1, wherein the adjacent phase rejection circuit comprises a microprocessor to compare the magnitudes and unaligned phase angles of the voltage signals from the coil segment ports to determine a relative location of a magnetic field source.

13. The multiport current sensor of claim 1, further comprising an individual integrator device connected to each coil segment port.

14. A fault detection system, comprising:

a multiport current sensor to measure current in a monitored conductor, the multiport current sensor configured to generate a respective voltage signal at each port in response to the current in the monitored conductor, the multiport current sensor comprising:

a first port connected to a first Rogowski coil section configured to be positioned on a first side of the monitored conductor in a location that is between the monitored conductor and an adjacent conductor, and a second port connected to a second Rogowski coil section configured to be positioned on a second side of the monitored conductor that is opposite the first side of the monitored conductor; and an analysis circuit to receive a voltage signal from each port of the multiport current sensor, the analysis circuit comprising:

a combining circuit to phase-align the voltage signals from the first port and the second port to a common phase reference and to add magnitudes of the phase-aligned voltage signals to produce an output signal corresponding to a magnitude of a current in the monitored conductor, and an adjacent conductor rejection circuit to compare at least one of (i) magnitudes and (ii) phase angles of the voltage signals from the first and second ports to generate a flag signal indicating the detection of an adjacent-conductor fault.

15. The fault detection system of claim 14, further comprising:

a fault determination subsystem to:

receive the output signal and the flag signal;

generate a fault signal indicating a fault on the monitored conductor in response to the output signal exceeding a fault threshold value; and ignore the fault signal in response to the flag signal indicating the detection of the fault in the adjacent conductor.

16. The fault detection system of claim 14, wherein the first Rogowski coil section comprises a first helically coiled wire with a first center return and the second Rogowski coil section comprises a second helically coiled wire with a second center return, wherein the first port comprises a first terminal connected to an end of the first helically coiled wire and a second terminal connected to an end of the first center return, and wherein the second port comprises a third terminal connected to an end of the second helically coiled wire and a fourth terminal connected to an end of the second center return.

17. The fault detection system of claim 16, wherein the first center return and the second center return are electrically connected, such that the second terminal of the first port and the fourth terminal of the second port are shared and form a center tap in a common center return.

18. The fault detection system of claim 14, wherein the combining circuit comprises:

a differential amplifier to subtract an inverted magnitude of the signal from the second port connected to the second Rogowski coil section from a non-inverted magnitude of the signal from the first port connected to the first Rogowski coil section.

19. The fault detection system of claim 14, wherein the adjacent conductor rejection circuit comprises:

a first stage summing amplifier to sum the signals from the first port and the second port without phase-aligning the signals; and a comparator circuit to compare an output of the first stage summing amplifier to the comparison threshold value and to generate the flag signal to indicate the adjacent-conductor fault in response to the output of the first stage summing amplifier exceeding a comparison threshold value.

20. The fault detection system of claim 14, wherein the monitored conductor is a first phase line in a three-phase powerline system and the adjacent conductor is a second phase line in the three-phase powerline system.

21. The fault detection system of claim 20, wherein the second Rogowski coil section is configured to be positioned on the second side of the monitored conductor between the monitored conductor and a third phase line in the three-phase powerline system.

22. The fault detection system of claim 14, wherein the analysis circuit further comprises an individual integrator device connected to each port of the multiport current sensor.

* * * * *